US010998250B2

United States Patent
Terasaki

(10) Patent No.: US 10,998,250 B2
(45) Date of Patent: May 4, 2021

(54) BONDED BODY AND INSULATING CIRCUIT SUBSTRATE

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/756,275

(22) PCT Filed: Nov. 1, 2018

(86) PCT No.: PCT/JP2018/040682
§ 371 (c)(1),
(2) Date: Apr. 15, 2020

(87) PCT Pub. No.: WO2019/088222
PCT Pub. Date: May 9, 2019

(65) Prior Publication Data
US 2020/0321264 A1 Oct. 8, 2020

(30) Foreign Application Priority Data

Nov. 2, 2017 (JP) .............................. JP2017-213155
Oct. 30, 2018 (JP) .............................. JP2018-204040

(51) Int. Cl.
*H01L 23/373* (2006.01)
*H05K 1/02* (2006.01)
(Continued)

(52) U.S. Cl.
CPC ...... *H01L 23/3731* (2013.01); *H01L 23/3736* (2013.01); *H05K 1/0271* (2013.01);
(Continued)

(58) Field of Classification Search
CPC ............. H01L 23/3732; H01L 23/3735; H01L 23/3736
See application file for complete search history.

(56) References Cited

U.S. PATENT DOCUMENTS

2002/0164475 A1   11/2002  Imamura et al.
2003/0056981 A1*  3/2003  Furukuwa ............ H05K 3/4046
                                                   174/258

(Continued)

FOREIGN PATENT DOCUMENTS

EP      2978018 A1   1/2016
EP      3041042 A1   7/2016
(Continued)

OTHER PUBLICATIONS

International Search Report dated Dec. 25, 2018, issued for PCT/JP2018/040682 and English translation thereof.
(Continued)

*Primary Examiner* — Hoa C Nguyen
(74) *Attorney, Agent, or Firm* — Locke Lord LLP

(57) ABSTRACT

A bonded body is formed to configured to join a ceramic member formed of a Si-based ceramic and a copper member formed of copper or a copper alloy, in which, in a joint layer formed between the ceramic member and the copper member, a crystalline active metal compound layer formed of a compound including an active metal is formed on the ceramic member side.

20 Claims, 8 Drawing Sheets

(51) Int. Cl.
*H05K 1/03* (2006.01)
*H05K 1/09* (2006.01)
*H05K 3/34* (2006.01)
*H05K 3/46* (2006.01)

(52) U.S. Cl.
CPC ............ *H05K 1/0306* (2013.01); *H05K 1/09* (2013.01); *H05K 3/341* (2013.01); *H05K 3/4644* (2013.01)

(56) References Cited

U.S. PATENT DOCUMENTS

| | | | | |
|---|---|---|---|---|
| 2009/0020321 | A1* | 1/2009 | Schulz-Harder | C04B 41/009 |
| | | | | 174/256 |
| 2011/0079418 | A1* | 4/2011 | Furuichi | H01L 21/4846 |
| | | | | 174/257 |
| 2012/0305281 | A1* | 12/2012 | Knoll | C04B 37/026 |
| | | | | 174/50 |
| 2013/0236738 | A1* | 9/2013 | Yamauchi | C23C 28/322 |
| | | | | 428/632 |
| 2014/0126155 | A1* | 5/2014 | Imamura | C22C 5/08 |
| | | | | 361/715 |
| 2014/0291699 | A1* | 10/2014 | Yano | H01L 23/3735 |
| | | | | 257/77 |
| 2016/0035660 | A1* | 2/2016 | Terasaki | B32B 15/01 |
| | | | | 174/252 |

FOREIGN PATENT DOCUMENTS

| | | |
|---|---|---|
| EP | 3121157 A1 | 1/2017 |
| JP | 3211856 B2 | 9/2001 |
| JP | 2002-201076 A | 7/2002 |
| JP | 2003-192462 A | 7/2003 |
| JP | 2012-136378 A | 7/2012 |
| JP | 5828352 B2 | 12/2015 |
| JP | 2017-035805 A | 2/2017 |
| WO | 2015/122446 A1 | 8/2015 |
| WO | 2018021472 A1 | 2/2018 |

OTHER PUBLICATIONS

Supplementary European Search Report dated Feb. 23, 2021, issued for European Patent Application No. 18873449.5.

* cited by examiner

BONDED BODY AND INSULATING CIRCUIT SUBSTRATE

TECHNICAL FIELD

The present invention relates to a bonded body, which is formed to configured to join a ceramic member and a copper member, and an insulating circuit substrate provided with the bonded body.

This application claims the priority of Japanese Patent Application No. 2017-213155 filed in Japan on Nov. 2, 2017 and Japanese Patent Application No. 2018-204040 filed in Japan on Oct. 30, 2018, the contents of which are incorporated herein.

BACKGROUND ART

Semiconductor devices such as LEDs or power modules have a structure in which a semiconductor element is joined on a circuit layer formed of a conductive material.

Power semiconductor elements for controlling large amounts of power used for controlling wind power generation, electric vehicles, hybrid vehicles, and the like generate large amounts of heat and therefore, insulating circuit substrates, which are, for example, provided with a ceramic substrate formed of $Si_3N_4$ (silicon nitride), or the like and a circuit layer formed to configured to join a metal plate with excellent conductivity to one surface of the ceramic substrate, are widely used in the related art as substrates on which the power semiconductor elements are mounted. As insulating circuit substrates, circuit substrates in which a metal plate is joined to the other surface of a ceramic substrate to form a metal layer are also provided.

For example, Patent Document 1 proposes a circuit substrate in which a circuit layer and a metal layer are formed to configured to join a copper sheet to one surface and the other surface of a ceramic substrate. In this circuit substrate, copper sheets are arranged on one surface and the other surface of a ceramic substrate with an Ag—Cu—Ti-based brazing material interposed therebetween, and the copper sheets are joined by performing a heat treatment (so-called active metal brazing method). In this active metal brazing method, since a brazing material containing Ti, which is an active metal, is used, the wettability between the molten brazing material and the ceramic substrate is improved, and the ceramic substrate and the copper sheet are joined well.

Here, in a case where the ceramic substrate and the copper sheet are joined by the active metal brazing method described in Patent Document 1, a TiN layer is formed at the joint interface between the ceramic substrate and the copper sheet. Since this TiN layer is hard and brittle, there is a concern that cracks may be generated in the ceramic substrate during loading of a thermal cycle.

Therefore, Patent Document 2 proposes a bonded body in which an active element oxide layer containing an active element and oxygen is formed at a joint interface between a copper member and a ceramic member, and the thickness of the active element oxide layer is in a range of 5 nm or more and 200 nm or less.

In the bonded body having this configuration, since the thickness of the active element oxide layer formed at the joint interface between the copper member and the ceramic member is 5 nm or more, the ceramic member and the copper member are securely joined and it is possible to ensure the brazing joining strength. On the other hand, since the thickness of the active element oxide layer is set to 200 nm or less, the thickness of the relatively hard and brittle active element oxide layer is small, and, for example, it is possible to suppress cracking from occurring in the ceramic member due to thermal stress during loading of a thermal cycle.

CITATION LIST

Patent Literature

Patent Document 1

Japanese Patent No. 3211856

Patent Document 2

Japanese Patent No. 5828352

SUMMARY OF INVENTION

Technical Problem

Here, in the circuit layer of the insulating circuit substrate described above, a terminal material may be joined with ultrasonic waves.

Here, in a case where the active metal oxide layer formed on the ceramic member side is amorphous, there is a concern that cracks may be generated with the amorphous active metal oxide layer as a starting point when ultrasonic waves are applied thereto and that the circuit layer may peel off.

The present invention was created in view of the circumstances described above and has an object of providing a bonded body which is able to suppress peeling between a ceramic member and a copper member even in a case where joining with ultrasonic waves is performed, and an insulating circuit substrate.

Solution to Problem

In order to solve the problem described-above, a bonded body of the present invention is formed to configured to join a ceramic member formed of a Si-based ceramic and a copper member formed of copper or a copper alloy, in which, in a joint layer formed between the ceramic member and the copper member, a crystalline active metal compound layer formed of a compound including an active metal is formed on a ceramic member side.

In the bonded body with this configuration, since a crystalline active metal compound layer formed of a compound including an active metal is formed on the ceramic member side of a joint layer formed between the ceramic member and the copper member, it is possible to suppress the generation of cracks starting from the active metal compound layer and to suppress peeling of the ceramic member and the copper member even in a case where ultrasonic waves are applied thereto.

Here, in the bonded body of the present invention, a thickness of the active metal compound layer is preferably in a range of 1.5 nm or more and 150 nm or less.

According to the bonded body with this configuration, since the thickness of the active metal compound layer is set in a range of 1.5 nm or more and 150 nm or less, the active metal compound layer with an appropriate thickness is present at the joint interface, it is possible to suppress the occurrence of cracking when subjected to a thermal cycle, and the thermal cycle reliability is excellent.

In addition, in the bonded body of the present invention, the active metal compound layer preferably contains one of an active metal nitride and an active metal oxide.

According to the bonded body with this configuration, since the active metal compound layer includes an active metal nitride or an active metal oxide, the joining property between the ceramic member and the copper member is improved and it is possible to further suppress peeling of the ceramic member and the copper member when ultrasonic waves are applied thereto.

An insulating circuit substrate of the present invention is provided with the bonded body described above, the insulating circuit substrate including a ceramic substrate, which is formed of the ceramic member, and a circuit layer, which is formed of the copper member formed on one surface of the ceramic substrate.

According to the insulating circuit substrate with this configuration, since a ceramic substrate, which is formed of the ceramic member, and a circuit layer, which is formed of the copper member formed on one surface of the ceramic substrate, are provided as the bonded body described above, it is possible to suppress the generation of cracks at the joining portion between the ceramic substrate and the circuit layer and to suppress peeling between the circuit layer and the ceramic substrate even in a case where joining with ultrasonic waves is applied to the circuit layer.

Here, in the insulating circuit substrate of the present invention, a metal layer is preferably formed on a surface of the ceramic substrate on a side opposite to the circuit layer.

In such a case, it is possible to efficiently dissipate heat on the circuit layer side through the metal layer formed on the surface of the ceramic substrate on the side opposite to the circuit layer. In addition, it is possible to suppress the generation of warpage of the ceramic substrate.

In addition, in the insulating circuit substrate of the present invention, the metal layer may be formed of copper or a copper alloy.

In such a case, since a metal layer formed of copper or a copper alloy is formed on the surface of the ceramic substrate on a side opposite to the circuit layer, it is possible to realize an insulating circuit substrate having excellent heat dissipation.

In addition, in the insulating circuit substrate according to the present invention, the metal layer may be formed of aluminum or an aluminum alloy.

In such a case, when thermal stress is applied to the ceramic substrate due to a metal layer formed of aluminum or an aluminum alloy having low deformation resistance being joined to the surface of the ceramic substrate on a side opposite to the circuit layer, it is possible to absorb this thermal stress with the metal layer formed of aluminum or an aluminum alloy and it is possible to suppress breakage of the ceramic substrate due to thermal stress.

Advantageous Effects of Invention

According to the present invention, it is possible to provide a bonded body which is able to suppress peeling of a ceramic member and a copper member even in a case where joining with ultrasonic waves is performed, and an insulating circuit substrate.

DESCRIPTION OF EMBODIMENTS

Figure 1:
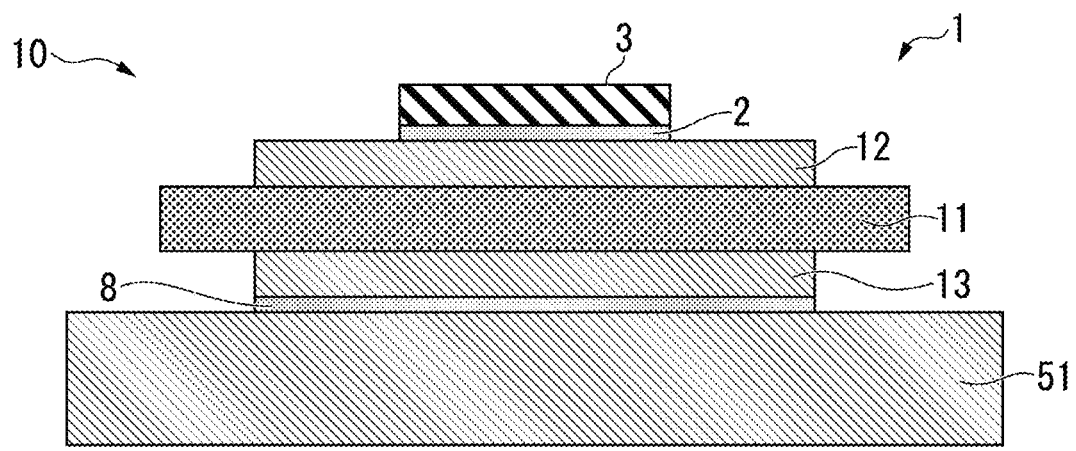
FIG. 1 is a schematic explanatory view of a power module using an insulating circuit substrate (bonded body) which is a first embodiment of the present invention.

A description will be given below of a bonded body and an insulating circuit substrate which are embodiments of the present invention with reference to the accompanying drawings. Here, each embodiment shown below is specifically described in order to facilitate understanding of the gist of the invention, and does not limit the invention unless otherwise specified. In addition, for convenience, in the drawings used in the following description, portions which are main parts may be enlarged and the dimensional ratios of each constituent component may not be the same as in practice, in order to make the features of the present invention easy to understand.

First Embodiment

A description will be given below of a first embodiment of the present invention with reference to FIG. 1 to FIG. 4.

The bonded body according to the embodiment of the present invention is an insulating circuit substrate 10 configured by joining a ceramic substrate 11 as a ceramic member formed of Si-based ceramics and a copper sheet 22 (circuit layer 12) as a copper member formed of copper or a copper alloy. Here, the Si-based ceramics refer to ceramics formed of a compound including an Si element.

FIG. 1 shows the insulating circuit substrate 10 which is an embodiment of the present invention and a power module 1 using the insulating circuit substrate.

The power module 1 is provided with the insulating circuit substrate 10, a semiconductor element 3 joined via a first solder layer 2 to one side (upper side in FIG. 1) of the insulating circuit substrate 10, and a heat sink 51 arranged via a second solder layer 8 on the other side (the lower side in FIG. 1) of the insulating circuit substrate 10.

Here, the first solder layer 2 and the second solder layer 8 are, for example, Sn—Ag based, Sn—In based, or Sn—Ag—Cu based solder material.

As shown in FIG. 1, the insulating circuit substrate 10 is provided with a ceramic substrate 11, a circuit layer 12 disposed on one surface (the upper surface in FIG. 1) of the ceramic substrate 11, and a metal layer 13 disposed on the other surface (the lower surface in FIG. 1) of the ceramic substrate 11.

The ceramic substrate 11 is formed of an Si-based ceramic, for example, silicon nitride ($Si_3N_4$) having excellent heat dissipation.

The thickness of the ceramic substrate 11 is set, for example, in the range of 0.2 to 1.5 mm and, in the present embodiment, 0.635 mm is used.

Figure 4:
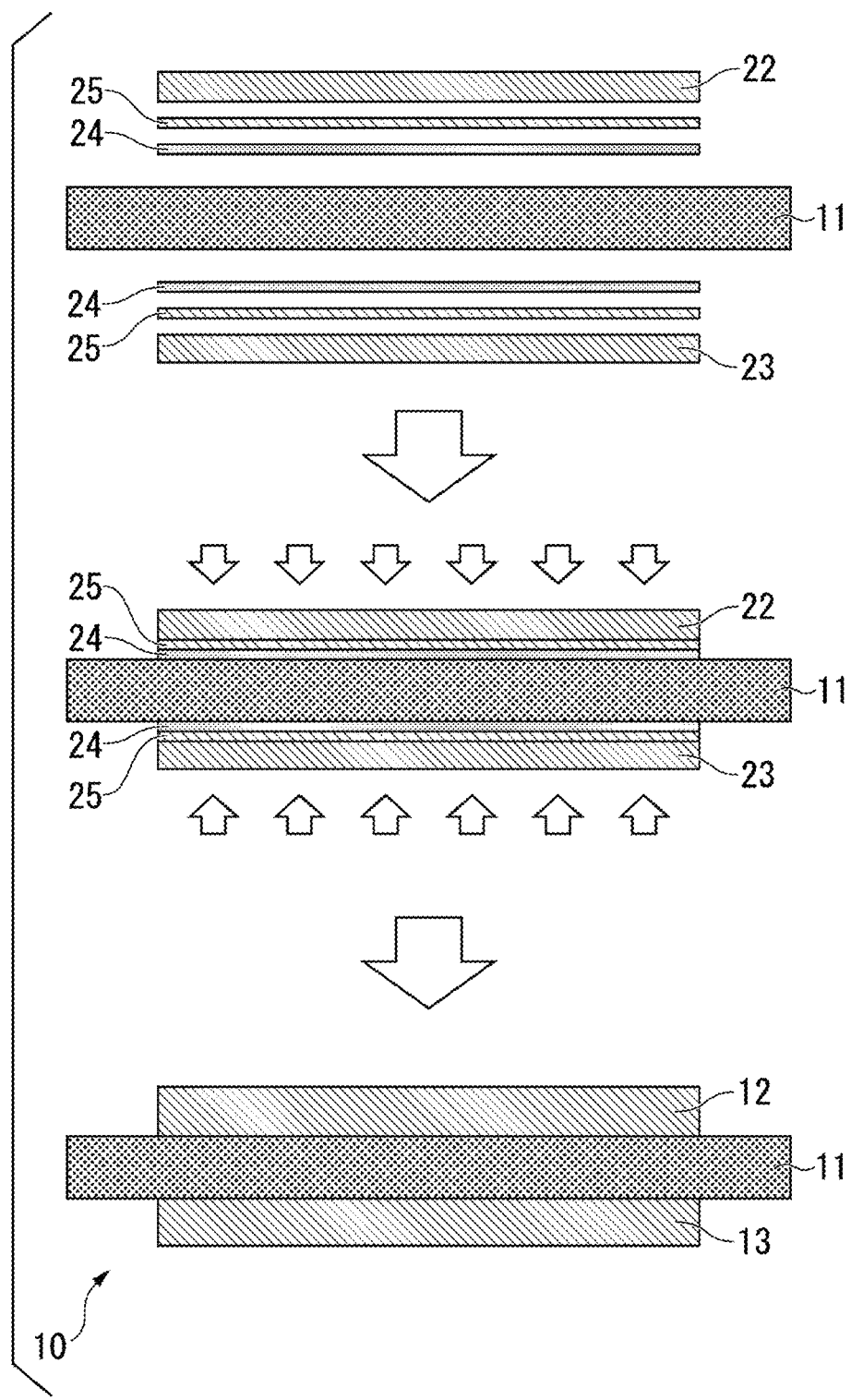
FIG. 4 is an explanatory view showing a method for manufacturing an insulating circuit substrate (bonded body) which is the first embodiment of the present invention.

The circuit layer 12 is formed to configured to join a copper sheet 22 formed of copper or a copper alloy to one surface of the ceramic substrate 11 as shown in FIG. 4. In the present embodiment, a rolled plate of oxygen-free copper is used as the copper sheet 22 forming the circuit layer 12. A circuit pattern is formed on the circuit layer 12 and one surface thereof (the upper surface in FIG. 1) is a mounting surface on which the semiconductor element 3 is mounted. Here, the thickness of the circuit layer 12 (copper sheet 22) is set in a range of 0.1 mm or more and 4.0 mm or less, and is set to 0.6 mm in the present embodiment.

As shown in FIG. 4, the metal layer 13 is formed to configured to join a copper sheet 23 formed of copper or a copper alloy to the other surface of the ceramic substrate 11. In the present embodiment, a rolled plate of oxygen-free copper is used as the copper sheet 23 forming the metal layer 13. Here, the thickness of the metal layer 13 (the copper sheet 23) is set in a range of 0.1 mm or more and 4.0 mm or less, and is set to 0.6 mm in the present embodiment.

The heat sink 51 is for cooling the insulating circuit substrate 10 described above and is a heat dissipating plate in the present embodiment. The heat sink 51 is desirably formed of a material having good thermal conductivity and is formed of A6063 (aluminum alloy) in the present embodiment.

In the present embodiment, the heat sink 51 is joined via the second solder layer 8 to the metal layer 13 of the insulating circuit substrate 10.

Figure 2:
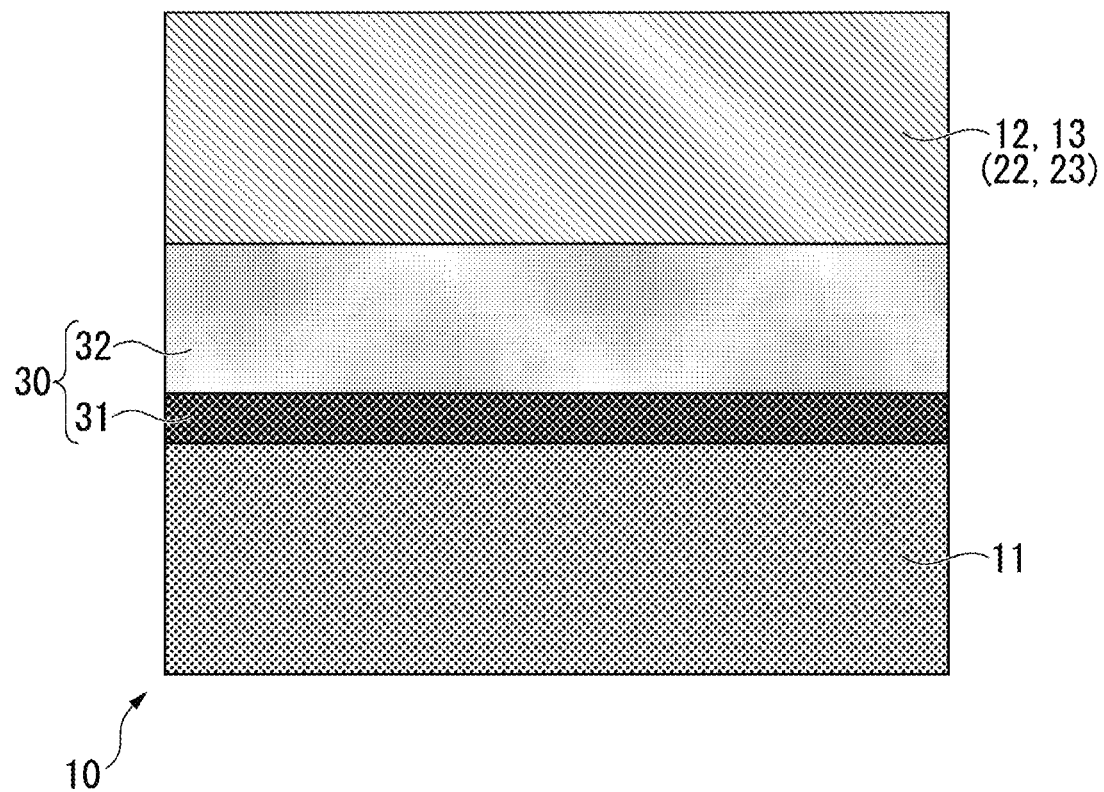
FIG. 2 is a schematic view of a joint interface between a circuit layer and a metal layer (copper member) and a ceramic substrate (ceramic member) of the insulating circuit substrate (bonded body) which is the first embodiment of the present invention.
Figure 3:
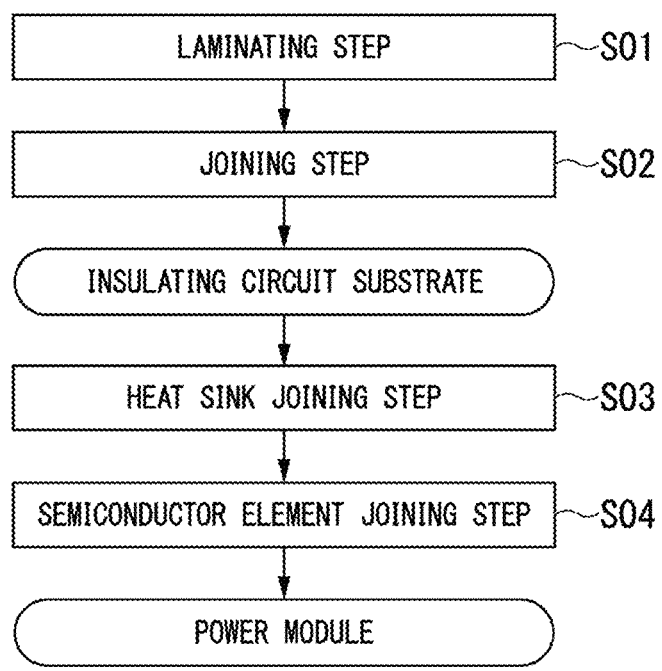
FIG. 3 is a flowchart showing a method for manufacturing an insulating circuit substrate (bonded body) which is the first embodiment of the present invention and a method for manufacturing a power module.

Here, an enlarged view of a joint interface between the circuit layer 12 (copper sheet 22) and the ceramic substrate 11 and between the metal layer 13 (copper sheet 23) and the ceramic substrate 11 is shown in FIG. 2.

As shown in FIG. 2, a joint layer 30 is formed at the joint interface between the ceramic substrate 11 and the circuit layer 12 (copper sheet 22) and the joint interface between the ceramic substrate 11 and the metal layer 13 (copper sheet 23).

As shown in FIG. 2, the joint layer 30 is provided with an active metal compound layer 31 formed of a compound including an active metal formed on the ceramic substrate 11 side and an alloy layer 32 formed between the active metal compound layer 31 and the circuit layer 12 (copper sheet 22) and the metal layer 13 (copper sheet 23).

In the present embodiment, as described below, since the circuit layer 12 (copper sheet 22) and the metal layer 13 (copper sheet 23) are joined to the ceramic substrate 11 using a Cu—P-based brazing material 24 and a titanium material 25 including Ti as an active metal, the active metal compound layer 31 is formed of a titanium compound.

The active metal compound layer 31 is formed of a crystalline titanium compound (titanium oxide or titanium nitride). It is possible to confirm the crystallinity of the active metal compound layer 31 by observing an electron diffraction pattern with a transmission electron microscope. In the present embodiment, the active metal compound layer 31 is formed of titanium oxide and a rutile-type electron diffraction pattern is observed.

Here, in the present embodiment, the thickness of the active metal compound layer 31 is preferably in the range of 1.5 nm or more and 150 nm or less.

In addition, the alloy layer 32 contains an alloy or an intermetallic compound including any of the components of the brazing material used during the joining. In the present embodiment, as described below, since the Cu—P-based brazing material 24, specifically, a Cu—P—Sn—Ni brazing material, is used, the alloy layer 32 has an alloy or an intermetallic compound including any of Cu, P, Sn, or Ni.

Next, a description will be given of a method for manufacturing the insulating circuit substrate 10 according to the present embodiment described above with reference to FIG. 3 and FIG. 4.

First, as shown in FIG. 4, the Cu—P-based brazing material 24, a titanium material 25, and the copper sheet 22 to be the circuit layer 12 are sequentially laminated on one surface (the upper surface in FIG. 4) of the ceramic substrate 11, while, the Cu—P-based brazing material 24, the titanium material 25, and the copper sheet 23 to be the metal layer 13 are sequentially laminated on the other surface (the lower surface in FIG. 4) of the ceramic substrate 11 (laminating step S01).

In the present embodiment, as the Cu—P-based brazing material 24, a Cu—P—Sn—Ni brazing material is used which includes P in the range of 3 mass % or more and 10 mass % or less, which includes Sn, which is a low-melting point element, in the range of 7 mass % or more and 50 mass % or less, and which includes Ni in a range of 2 mass % or more and 15 mass % or less.

Here, the thickness of the Cu—P-based brazing material 24 is in a range of 10 μm or more and 50 μm or less.

In addition, in the present embodiment, the thickness of the titanium material 25 including Ti as an active metal element is in a range of 0.05 μm or more and 2 μm or less. Here, the titanium material 25 is preferably formed by vapor deposition or sputtering in a case where the thickness thereof is 0.1 μm or more and 1.0 μm or less, and a foil material is preferably used in a case where the thickness thereof is 1.0 μm or more.

Next, the ceramic substrate 11, the Cu—P-based brazing material 24, the titanium material 25, the copper sheet 22, and the copper sheet 23 are charged into a vacuum heating furnace in a state of being pressed (pressure: 1 to 35 kgf/cm² (0.1 MPa to 3.5 MPa)) in the laminating direction, heated, and joined (joining step S02).

In the present embodiment, the pressure inside the vacuum heating furnace is in a range of $10^{-6}$ Pa or more and $10^{-3}$ Pa or less.

In addition, the heating temperature is set in a range of 770° C. or higher and 980° C. or lower and the holding time at the heating temperature is set in a range of 5 minutes or more and 150 minutes or less. Furthermore, the heating rate from 600° C. to 730° C. is set in a range of 5° C./min or more and 20° C./min or less.

Here, in a case where the thickness of the titanium material 25 including Ti which is an active metal element is less than 0.05 μm, there is a concern that the joining between the ceramic substrate 11 and the copper sheets 22 and 23 may be insufficient. On the other hand, in a case where the thickness of the titanium material 25 exceeds 2 µm, there is a concern that decomposition of the ceramic substrate 11 will be promoted and cracks may be generated during joining with ultrasonic waves.

From the above, in the present embodiment, the thickness of the titanium material 25 is set in a range of 0.05 µm or more and 2 µm or less.

In order to reliably join the ceramic substrate 11 and the copper sheets 22 and 23, the lower limit of the thickness of the titanium material 25 is preferably 0.3 µm or more, and more preferably 0.5 µm or more. On the other hand, in order to suppress the decomposition of the ceramic substrate 11, the upper limit of the thickness of the titanium material 25 is preferably 1.8 µm or less, and more preferably 1.5 µm or less.

In a case where the thickness of the Cu—P-based brazing material 24 is less than 10 µm, there is a concern that the joining between the ceramic substrate 11 and the copper sheets 22 and 23 may be insufficient. On the other hand, in a case where the thickness of the Cu—P-based brazing material 24 exceeds 50 µm, there is a concern that decomposition of the ceramic substrate 11 will be promoted and cracks may be generated during joining with ultrasonic waves.

From the above, in the present embodiment, the thickness of the Cu—P-based brazing material 24 is set in the range of 10 µm to 50 µm.

In order to securely join the ceramic substrate 11 and the copper sheets 22 and 23, the lower limit of the thickness of the Cu—P-based brazing material 24 is preferably 15 µm or more, and more preferably 20 µm or more. On the other hand, in order to suppress the decomposition of the ceramic substrate 11, the upper limit of the thickness of the Cu—P-based brazing material 24 is preferably 40 µm or less, and more preferably 35 µm or less.

In a case where the heating temperature is less than 770° C. in the joining step S02, there is a concern that the joining between the ceramic substrate 11 and the copper sheets 22 and 23 may be insufficient. On the other hand, in a case where the heating temperature exceeds 980° C. in the joining step S02, there is a concern that microcracks may be generated due to thermal deterioration of the ceramic substrate 11 and that cracking may be generated in the ceramic substrate 11 during joining with ultrasonic waves.

From the above, in the present embodiment, the heating temperature is set in a range of 770° C. or higher and 980° C. or lower in the joining step S02.

In order to securely join the ceramic substrate 11 and the copper sheets 22 and 23, the lower limit of the heating temperature in the joining step S02 is preferably 810° C. or higher, and more preferably 850° C. or higher. On the other hand, in order to suppress thermal deterioration of the ceramic substrate 11, the upper limit of the heating temperature in the joining step S02 is preferably 950° C. or lower, and more preferably 930° C. or lower.

In a case where the holding time at the heating temperature is less than 5 minutes in the joining step S02, there is a concern that the joining between the ceramic substrate 11 and the copper sheets 22 and 23 may be insufficient. On the other hand, in a case where the holding time at the heating temperature exceeds 150 minutes in the joining step S02, there is a concern that decomposition of the ceramic substrate 11 will be promoted and cracks may be generated during joining with ultrasonic waves.

From the above, in the present embodiment, the holding time at the heating temperature is set in a range of 5 minutes or more and 150 minutes or less.

In order to securely join the ceramic substrate 11 and the copper sheets 22 and 23, the lower limit of the holding time at the heating temperature in the joining step S02 is preferably 15 minutes or more, and more preferably 30 minutes or more. On the other hand, in order to suppress decomposition of the ceramic substrate 11, the upper limit of the holding time at the heating temperature in the joining step S02 is preferably 120 minutes or less, and more preferably 100 minutes or less.

In a case where the heating rate from 600° C. to 730° C. in the joining step S02 is less than 5° C./min, there is a concern that decomposition of the ceramic substrate 11 will be promoted and cracks may be generated during joining with ultrasonic waves. On the other hand, in a case where the heating rate from 600° C. to 730° C. in the joining step S02 exceeds 20° C./min, there is a concern that microcracks may be generated in the ceramic substrate 11 due to thermal shock and cracking may be generated in the ceramic substrate 11 during joining with ultrasonic waves.

From the above, in the present embodiment, the heating rate from 600° C. to 730° C. in the joining step S02 is set in the range of 5° C./min or more to 20° C./min or less.

In order to suppress the decomposition of the ceramic substrate 11, the lower limit of the heating rate from 600° C. to 730° C. in the joining step S02 is preferably 7° C./min or more, and more preferably 10° C./min or more. On the other hand, in order to suppress the generation of microcracks due to thermal shock, the upper limit of the heating rate from 600° C. to 730° C. in the joining step S02 is preferably 15° C./min or less, and more preferably 13° C./min or less.

The insulating circuit substrate 10 according to the present embodiment is manufactured by the laminating step S01 and the joining step S02 above.

Next, the heat sink 51 is soldered and joined to the other surface side of the metal layer 13 of the insulating circuit substrate 10 (heat sink joining step S03).

Furthermore, the semiconductor element 3 is joined by soldering to one surface of the circuit layer 12 of the insulating circuit substrate 10 (semiconductor element joining step S04).

Through the above steps, the power module 1 shown in FIG. 1 is produced.

According to the insulating circuit substrate 10 (bonded body) of the present embodiment having the above configuration, since the active metal compound layer 31 formed of crystalline titanium oxide is formed on the ceramic substrate 11 side of the joint layer 30 formed between the ceramic substrate 11 and the circuit layer 12 and the metal layer 13, it is possible to suppress the generation of cracks starting from the active metal compound layer 31 and to suppress the ceramic substrate 11 from peeling from the circuit layer 12 and the metal layer 13 even in a case where ultrasonic waves are applied thereto.

In addition, in the present embodiment, since the thickness of the active metal compound layer 31 is 1.5 nm or more, the strength in the vicinity of the joint interface of the ceramic substrate 11 is appropriately improved by the active metal compound layer 31 and it is possible to suppress the generation of cracking of the ceramic substrate 11 during loading of the thermal cycle. On the other hand, since the thickness of the active metal compound layer 31 is 150 nm or less, it is possible to suppress the thermal strain generated in the ceramic substrate 11 during loading of the thermal cycles without excessively forming the hard active metal compound layer 31 and to suppress the generation of cracking in the ceramic substrate 11 during loading of the thermal cycles. The lower limit of the thickness of the active metal compound layer 31 is preferably 3 nm or more, and more preferably 5 nm or more. On the other hand, the upper limit of the thickness of the active metal compound layer 31 is preferably 60 nm or less, and more preferably 20 nm or less.

Further, in the present embodiment, since the ceramic substrate 11 is formed of silicon nitride ($Si_3N_4$), it is possible to manufacture the insulating circuit substrate 10 having excellent insulation and heat resistance.

Furthermore, since the active metal compound layer 31 is formed of titanium oxide, the joining property between the ceramic substrate 11 and the circuit layer 12 and the metal layer 13 is improved and it is possible to further suppress the ceramic substrate 11 from peeling from the circuit layer 12 and the metal layer 13.

Furthermore, in the present embodiment, since the metal layer 13 is formed on the surface of the ceramic substrate 11 on the side opposite to the circuit layer 12, it is possible to efficiently dissipate the heat generated in the semiconductor element 3. In addition, it is possible to suppress the generation of warpage of the ceramic substrate 11.

In addition, since the metal layer 13 is formed of copper or a copper alloy, it is possible to realize the insulating circuit substrate 10 having excellent heat dissipation.

Second Embodiment

Next, a description will be given of a second embodiment of the present invention. In addition, the same reference numerals are used in the description where the configuration is the same as the first embodiment and detailed description thereof is omitted.

Figure 5:
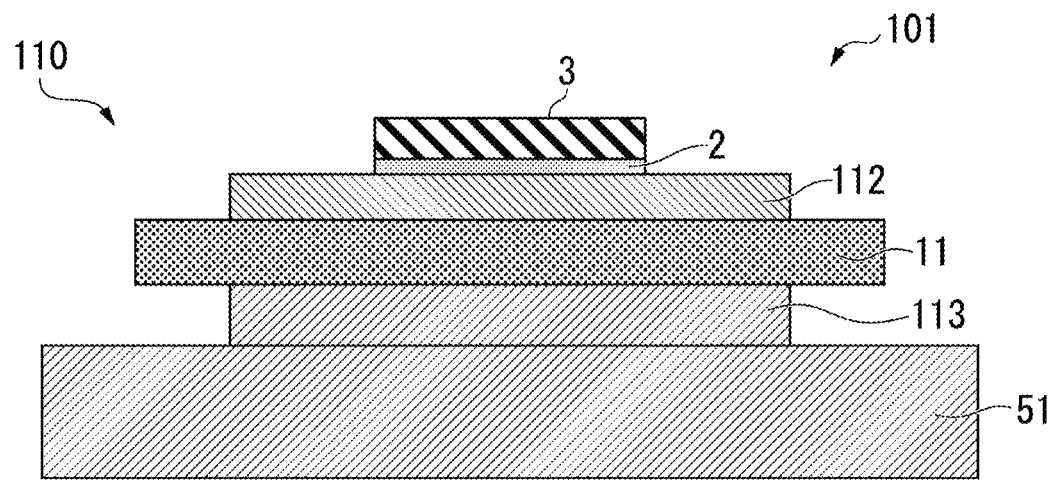
FIG. 5 is a schematic explanatory view of a power module using an insulating circuit substrate (bonded body) which is a second embodiment of the present invention.

FIG. 5 shows a power module 101 provided with an insulating circuit substrate 110 according to the second embodiment of the present invention.

The power module 101 is provided with the insulating circuit substrate 110, the semiconductor element 3 joined via the solder layer 2 to one surface (the upper surface in FIG. 5) of the insulating circuit substrate 110, and the heat sink 51 joined to a lower side of the insulating circuit substrate 110.

Figure 8:
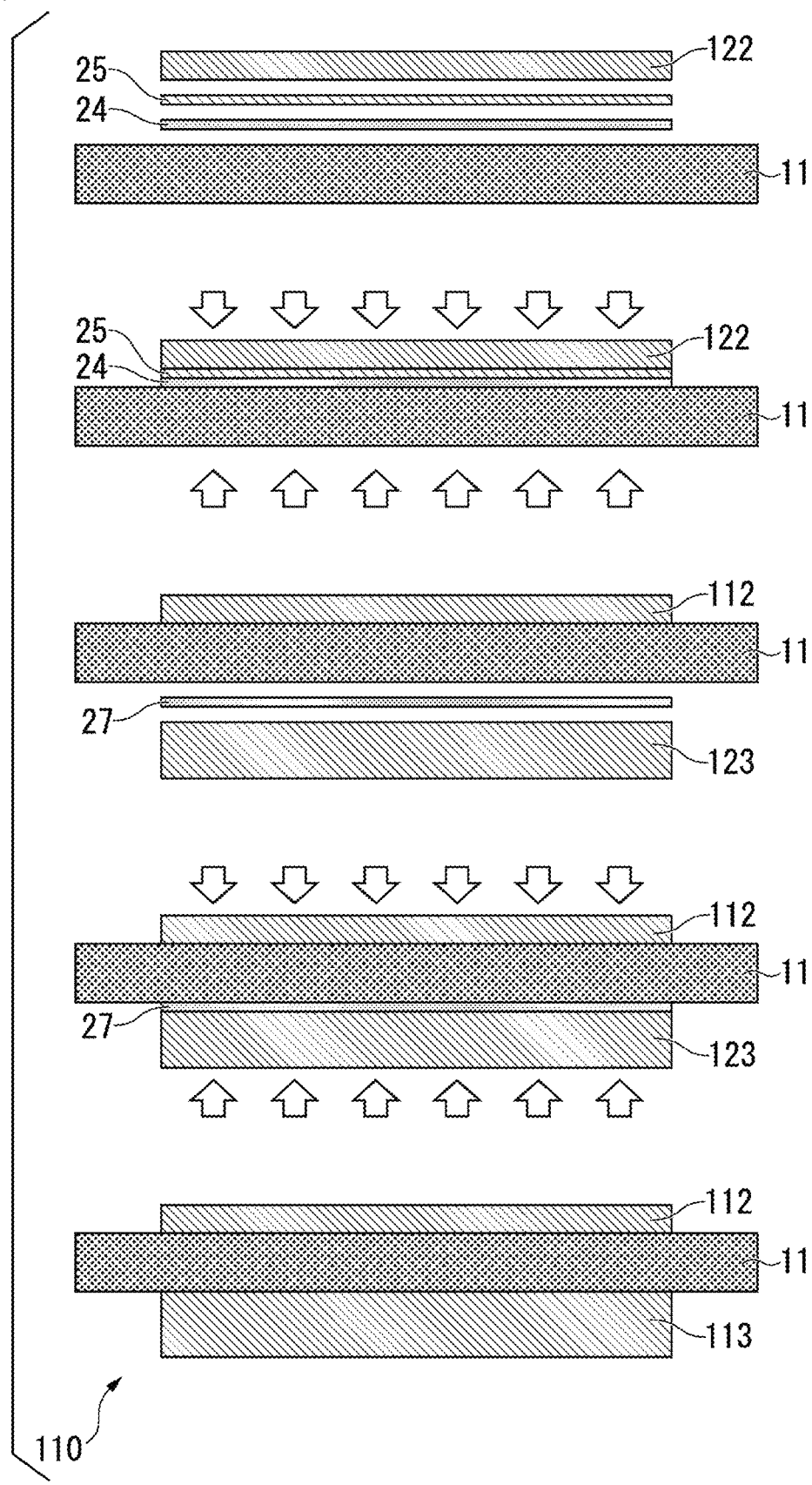
FIG. 8 is an explanatory view showing a method for manufacturing an insulating circuit substrate (bonded body) which is the second embodiment of the present invention.

As shown in FIG. 8, a circuit layer 112 is formed to configured to join a copper sheet 122 formed of copper or a copper alloy to one surface of the ceramic substrate 11. In the present embodiment, a rolled plate of oxygen-free copper is used as the copper sheet 122 forming the circuit layer 112. A circuit pattern is formed on the circuit layer 112, and one surface thereof (the upper surface in FIG. 5) is a mounting surface on which the semiconductor element 3 is mounted. Here, the thickness of the circuit layer 112 (copper sheet 122) is set in a range of 0.1 mm or more and 1.0 mm or less and is set to 0.6 mm in the present embodiment.

As shown in FIG. 8, a metal layer 113 is formed to configured to join an aluminum sheet 123 formed of aluminum or an aluminum alloy to the other surface of the ceramic substrate 11. In the present embodiment, a rolled plate of aluminum (4N aluminum) having a purity of 99.99 mass % or more is used as the aluminum sheet 123 forming the metal layer 113. Here, the thickness of the metal layer 113 (aluminum sheet 123) is set in the range of 0.2 mm or more and 6 mm or less and is set to 2.0 mm in the present embodiment.

In the present embodiment, the heat sink 51 is joined to the metal layer 113 of the insulating circuit substrate 110 using an Al—Si-based brazing material or the like.

Figure 6:
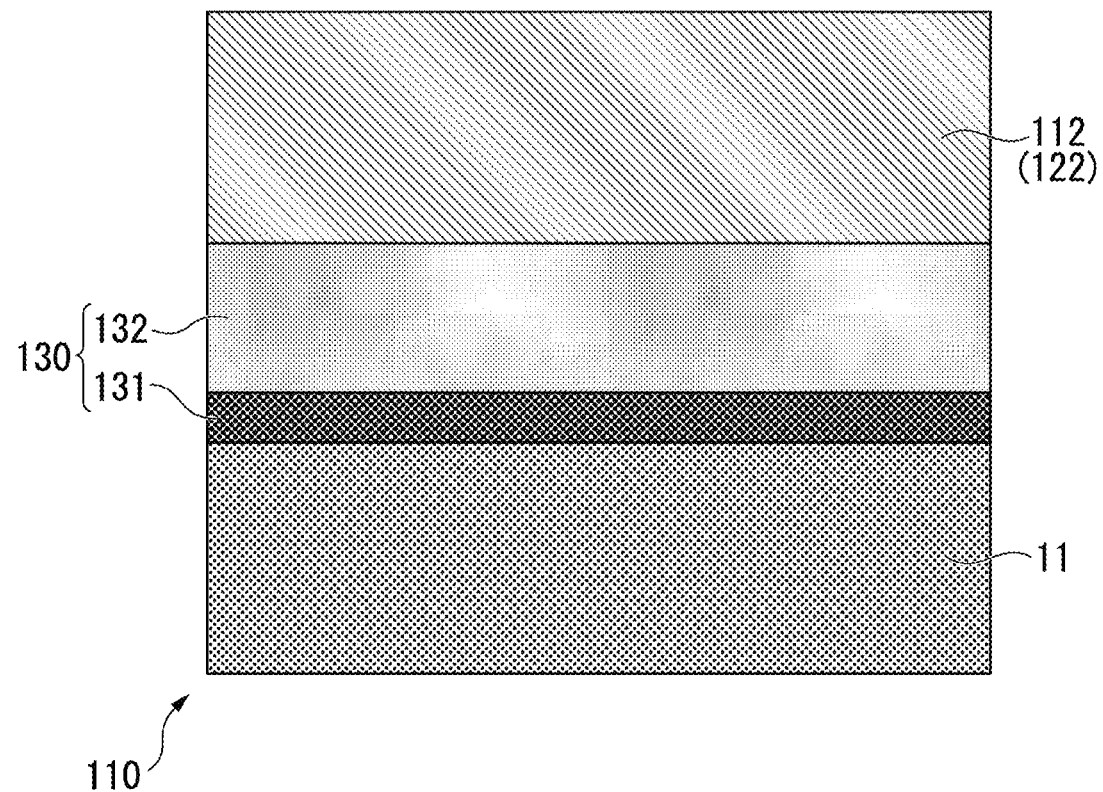
FIG. 6 is a schematic view of a joint interface between a circuit layer (copper member) and a ceramic substrate (ceramic member) of an insulating circuit substrate (bonded body) which is the second embodiment of the present invention.

Here, an enlarged view of the joint interface between the circuit layer 112 (copper sheet 122) and the ceramic substrate 11 is shown in FIG. 6.

As shown in FIG. 6, a joint layer 130 is formed at a joint interface between the ceramic substrate 11 and the circuit layer 112 (copper sheet 122).

As shown in FIG. 6, the joint layer 130 is provided with an active metal compound layer 131 formed of a compound including an active metal formed on the ceramic substrate 11 side, and an alloy layer 132 formed between the active metal compound layer 131 and the circuit layer 112 (copper sheet 122).

In the present embodiment, as described below, since the circuit layer 112 (copper sheet 122) and the ceramic substrate 11 are joined using the Cu—P-based brazing material 24 and the titanium material 25 containing Ti as an active metal, the active metal compound layer 131 is formed of a titanium compound.

The active metal compound layer 131 is formed of a crystalline titanium compound (titanium oxide or titanium nitride). Here, it is possible to confirm the crystallinity of the active metal compound layer 131 by observing an electron diffraction pattern with a transmission electron microscope. In the present embodiment, the active metal compound layer 131 is formed of titanium oxide and a rutile-type electron diffraction pattern is observed.

Here, in the present embodiment, the thickness of the active metal compound layer 131 is preferably in the range of 1.5 nm or more and 150 nm or less.

In addition, the alloy layer 132 contains an alloy or an intermetallic compound including any of the components of the brazing material used during the joining. In the present embodiment, since the Cu—P-based brazing material 24, specifically, the Cu—P—Sn—Ni brazing material, is used, the alloy layer 132 has an alloy or an intermetallic compound including any of Cu, P, Sn, and Ni.

Figure 7:
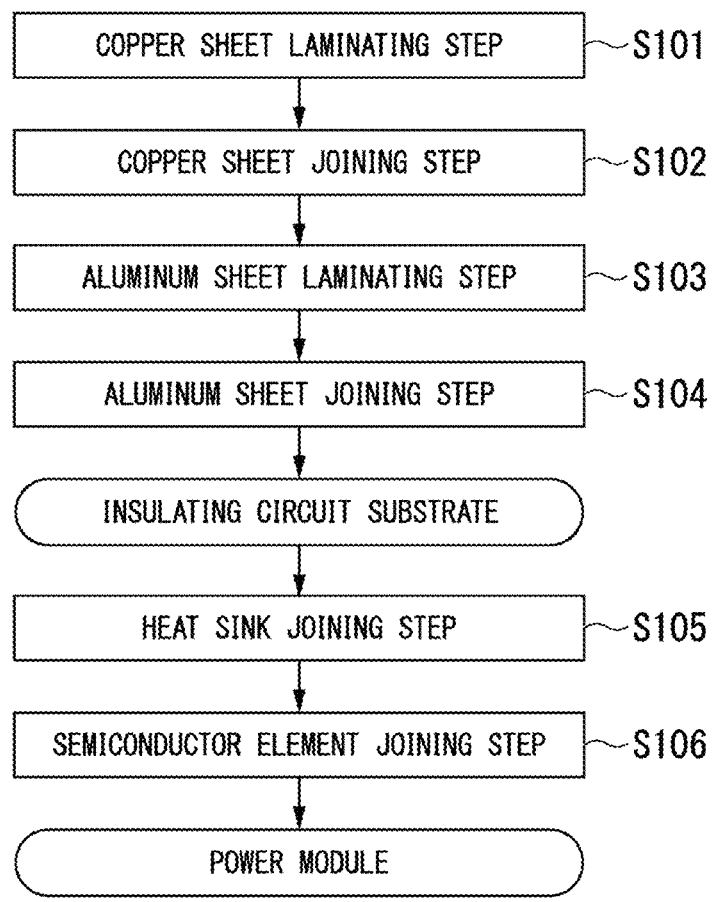
FIG. 7 is a flowchart showing a method for manufacturing an insulating circuit substrate (bonded body) which is the second embodiment of the present invention and a method for manufacturing a power module.

Next, a description will be given of a method for manufacturing the insulating circuit substrate 110 according to the present embodiment described above with reference to FIG. 7 and FIG. 8.

First, as shown in FIG. 8, the Cu—P-based brazing material 24, the titanium material 25, and the copper sheet 122 to be the circuit layer 112 are sequentially laminated on one surface (the upper surface in FIG. 8) of the ceramic substrate 11 (copper sheet laminating step S101).

The same conditions as in the first embodiment apply to the thickness and the like of the Cu—P-based brazing material 24 and the titanium material 25.

Next, the ceramic substrate 11, the Cu—P-based brazing material 24, the titanium material 25, and the copper sheet 122 are charged into a vacuum heating furnace in a state of being pressed (pressure: 1 to 35 kgf/$cm^2$ (0.1 MPa to 3.5 MPa)) in the laminating direction, heated, and joined (copper sheet joining step S102).

In the present embodiment, the pressure inside the vacuum heating furnace is in a range of $10^{-6}$ Pa or more and $10^{-3}$ Pa or less.

In addition, the heating temperature is set in a range of 770° C. or higher and 980° C. or lower and the holding time at the heating temperature is set in a range of 5 minutes or more and 150 minutes or less. Furthermore, the heating rate from 600° C. to 730° C. is set in a range of 5° C./min or more to 20° C./min or less.

Next, as shown in FIG. 8, on the other surface (the lower surface in FIG. 8) of the ceramic substrate 11, an Al—Si-based brazing material 27 and an aluminum sheet 123 to be the metal layer 113 are sequentially laminated (aluminum sheet laminating step S103).

Here, in the present embodiment, a brazing material foil formed of an aluminum alloy containing Si in a range of 7 mass % or more and 12 mass % or less is used as the Al—Si-based brazing material 27 and the thickness of the Al—Si-based brazing material 27 is set in a range of 5 μm or more and 30 μm or less.

Next, the ceramic substrate 11, the Al—Si-based brazing material 27, and the aluminum sheet 123 are charged into a vacuum heating furnace in a state of being pressed (pressure: 1 to 35 kgf/cm$^2$ (0.1 MPa to 3.5 MPa)) in the laminating direction, heated, and joined (aluminum sheet joining step S104).

In the present embodiment, the pressure inside the vacuum heating furnace is in a range of $10^{-6}$ Pa or more and $10^{-3}$ Pa or less.

In addition, the heating temperature is in a range of 580° C. or higher and 650° C. or lower and the holding time at the heating temperature is in the range of 1 minute or more and 180 minutes or less.

The insulating circuit substrate 110 which is the present embodiment is manufactured by the copper sheet laminating step S101, the copper sheet joining step S102, the aluminum sheet laminating step S103, and the aluminum sheet joining step S104 above.

Next, the heat sink 51 is joined to the other surface of the metal layer 113 of the insulating circuit substrate 110 using an Al—Si-based brazing material (heat sink joining step S105).

Furthermore, the semiconductor element 3 is joined by soldering to one surface of the circuit layer 112 of the insulating circuit substrate 110 (semiconductor element joining step S106).

Through the above steps, the power module 101 shown in FIG. 5 is produced.

According to the insulating circuit substrate 110 (bonded body) of the present embodiment having the configuration described above, since the active metal compound layer 131 formed of crystalline titanium oxide is formed on the ceramic substrate 11 side of the joint layer 130 formed between the ceramic substrate 11 and the circuit layer 112, it is possible to suppress the generation of cracks starting from the active metal compound layer 131 and to suppress peeling of the ceramic substrate 11 and the circuit layer 112 even when ultrasonic waves are applied thereto.

In addition, in the present embodiment, since the thickness of the active metal compound layer 131 is in the range of 1.5 nm or more and 150 nm or less, it is possible to suppress the generation of cracking in the ceramic substrate 11 during loading of the thermal cycles.

Here, the lower limit of the thickness of the active metal compound layer 131 is preferably 3 nm or more, and more preferably 5 nm or more. On the other hand, the upper limit of the thickness of active metal compound layer 131 is preferably 60 nm or less, and more preferably 20 nm or less.

In addition, in the present embodiment, since the ceramic substrate 11 is formed of silicon nitride ($Si_3N_4$), it is possible to manufacture the insulating circuit substrate 110 having excellent insulation and heat resistance.

Furthermore, since the active metal compound layer 131 is formed of titanium oxide, the joining property between the ceramic substrate 11 and the circuit layer 112 is improved and it is possible to further suppress peeling of the ceramic substrate 11 and the circuit layer 112.

Furthermore, in the present embodiment, since the metal layer 113 is formed on the surface of the ceramic substrate 11 on the side opposite to the circuit layer 112, it is possible to efficiently dissipate the heat generated in the semiconductor element 3. In addition, it is possible to suppress the generation of warpage of the ceramic substrate 11.

In addition, since the metal layer 113 is formed of aluminum or an aluminum alloy, it is possible to absorb thermal stress in the metal layer 113 and to suppress the load on the ceramic substrate 11 during the thermal cycle.

A description was given above of the embodiments of the present invention, but the present invention is not limited thereto, and it is possible to make appropriate changes thereto without departing from the technical idea of the present invention.

For example, in the present embodiment, a description was given in which a metal layer was formed on the surface of the ceramic substrate on a side opposite to the circuit layer; however, the present invention is not limited thereto and the metal layer may not be provided.

In addition, the heat sink is not limited to the heat sink shown in the present embodiment, and the structure of the heat sink is not particularly limited.

Furthermore, a buffer layer formed of aluminum, an aluminum alloy, or a composite material including aluminum (for example, AlSiC or the like) may be provided between the heat sink and the metal layer.

In addition, in the present embodiment, a description was given in which a power module is configured by mounting a semiconductor element on an insulating circuit substrate; however, the present invention is not limited thereto. For example, an LED module may be configured by mounting an LED element on a circuit layer of an insulating circuit substrate, or a thermoelectric module may be configured by mounting a thermoelectric element on a circuit layer of an insulating circuit substrate.

Furthermore, in the present embodiment, a description was given in which Ti is used as the active metal; however, the present invention is not limited thereto, and one type or two or more types of active metals selected from Ti, Nb, Hf, and Zr may be used.

In addition, in the present embodiment, a description was given of the active metal compound layer as being formed of titanium oxide; however, the present invention is not limited thereto, and the active metal compound layer may be formed of titanium nitride.

Furthermore, as a brazing material used when joining a ceramic substrate and a copper sheet, a description was given of a Cu—P—Sn—Ni brazing material as an example; however, the brazing material is not limited thereto, and other brazing materials may be used.

Furthermore, in the present embodiment, a description was given in which the alloy layer has an alloy or an intermetallic compound including any of Cu, P, Sn, and Ni; however, the present invention is not limited thereto and any alloy or intermetallic compound including any of the components of the brazing materials used during joining is sufficient. For example, in a case where the brazing material contains Zn, an alloy or an intermetallic compound including Zn may be contained.

EXAMPLES

Example 1

A copper sheet (6 mm×6 mm×0.3 mm thickness) formed of oxygen-free copper is sequentially laminated using a brazing material and an active metal material described in Table 1 on one surface of a ceramic substrate (26 mm×26 mm×0.32 mm thickness) formed of the material shown in Table 1 to form a laminate.

Then, the laminate was put into a vacuum heating furnace in a state of being pressed under the load shown in Table 2, and heated to join a copper sheet to one surface of the ceramic substrate. The heating temperature and time were as shown in Table 2.

In the manner described above, the joint bodies of the Examples of the present invention and the Comparative Examples were obtained. For the obtained joint bodies, the "Material and Crystallinity of Active Metal Compound Layer" and the "Ultrasonic Wave Joining Property" were evaluated.

(Material and Crystallinity of Active Metal Compound Layer)

Measurement was carried out using a transmission electron microscope (Titan ChemiSTEM, manufactured by FEI, accelerating voltage: 200 kV) at a magnification of 80,000 times to acquire element mapping of the N, O, and active metal element using the energy dispersive X-ray analysis method (NSS7 manufactured by Thermo Scientific). It was determined that an active metal compound layer was present in a case where the active metal element and N or O existed in the same region.

Furthermore, in a case where lattice fringes were observed in the high-resolution image of the active metal compound layer and diffraction spots were confirmed in a diffraction image obtained by carrying out a fast Fourier transform on the high-resolution image, the active metal compound layer was determined to be crystalline.

Table 2 shows the evaluation results.

Figure 9:
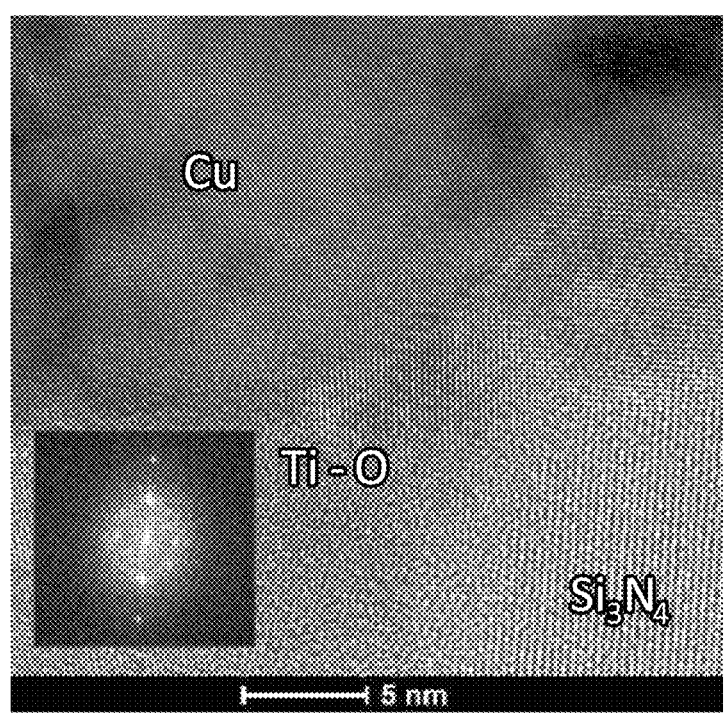
FIG. 9 shows observation results in the vicinity of the ceramic substrate of Example 1 of the present invention in the Examples.
Figure 10:
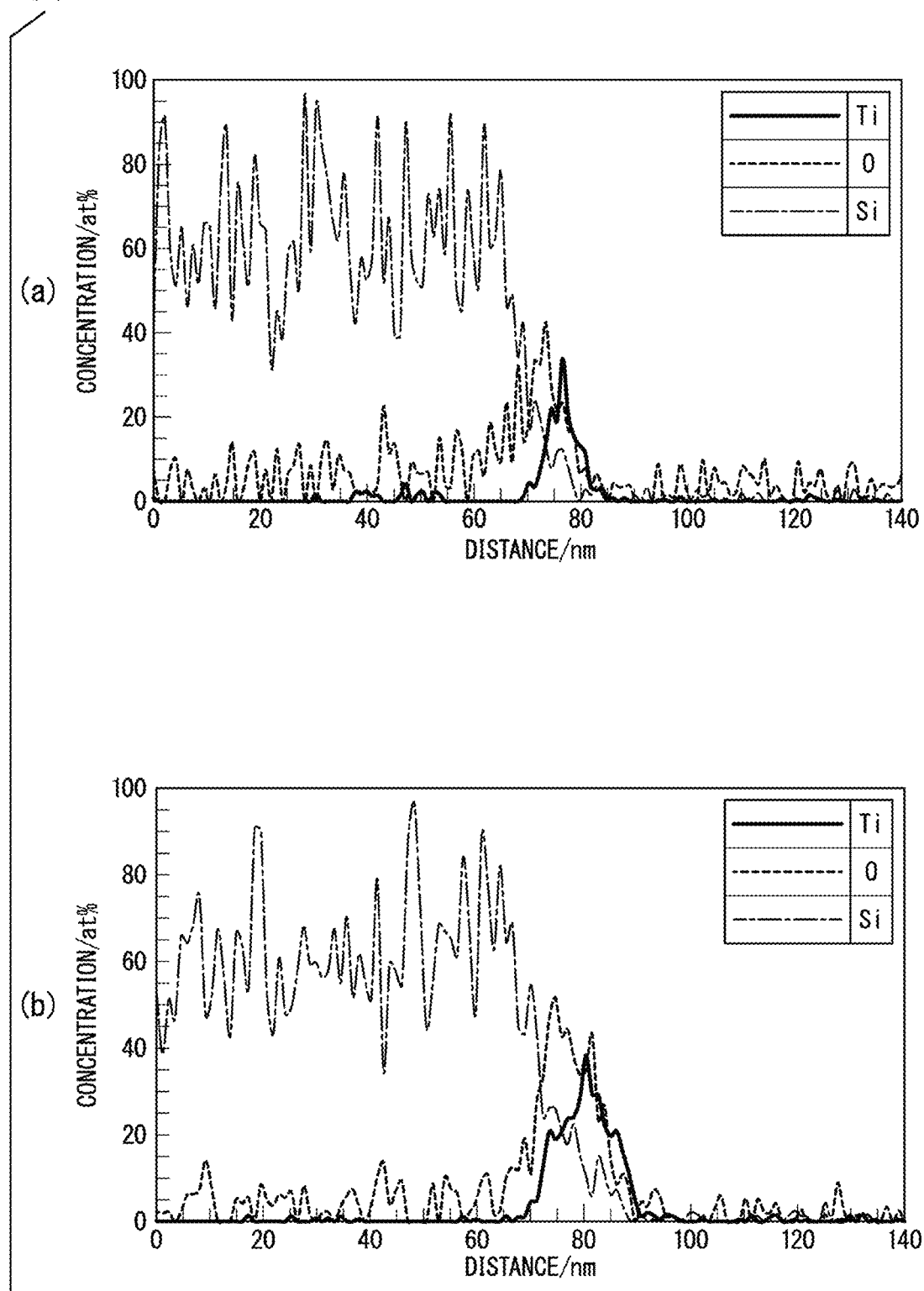
FIG. 10 shows line analysis results in the vicinity of the ceramic substrate in Examples. (a) is Comparative Example 1 and (b) is Example 1 of the present invention.

In addition, FIG. 9 shows a "transmission electron microscope observation of the joint interface between the ceramic substrate and the copper sheet" of Example 1 of the present invention and FIG. 10 shows the "line analysis results in the vicinity of the ceramic substrate".

(Presence or Absence of Peeling after Ultrasonic Wave Joining)

Using an ultrasonic wave metal joining machine (60C-904, manufactured by Ultrasonic Engineering Co., Ltd.), a copper terminal (10 mm×5 mm×1 mm thick) was joined to the obtained bonded body by ultrasonic waves under the condition of a Co-plus amount of 0.3 mm.

After joining, a product in which peeling occurred at the joint interface between the copper sheet and the ceramic substrate was evaluated as "C". In addition, for products in which clear peeling was not confirmed, the joint interface between the copper sheet and the ceramic substrate was further inspected using an ultrasonic flaw detector (Fine-SAT200 manufactured by Hitachi Solutions, Ltd.), products where peeling was observed were evaluated as "B", and products where peeling was not confirmed at either stage were evaluated as "A". Table 2 shows the evaluation results.

TABLE 1

| | Ceramic substrate | Brazing material | | Active metal material | |
|---|---|---|---|---|---|
| | Material | Material | Thickness (μm) | Material | Thickness |
| Invention Example 1 | Si$_3$N$_4$ | Cu-6.3 mass % P-9.3 mass % Sn-7 mass % Ni | 20 | Ti | 0.3 |
| Invention Example 2 | Si$_3$N$_4$ | Cu-6.3 mass % P-9.3 mass % Sn-7 mass % Ni | 50 | Ti | 0.05 |
| Invention Example 3 | Si$_3$N$_4$ | Cu-7 mass % P-15 mass % Sn-10 mass % Ni | 20 | Ti | 2 |
| Invention Example 4 | Si$_3$N$_4$ | Cu-7 mass % P-15 mass % Zn-3 mass % Mn | 35 | Zr | 1.5 |
| Invention Example 5 | Si$_3$N$_4$ | Cu-7 mass % P-15 mass % Sn-3 mass % Mn | 10 | Zr | 1.8 |
| Invention Example 6 | Si$_3$N$_4$ | Cu-7 mass % P-15 mass % Sn-10 mass % Ni | 20 | Ti | 1.5 |
| Invention Example 7 | Si$_3$N$_4$ | Cu-7 mass % P-15 mass % Zn-5 mass % Cr | 35 | Nb | 1.8 |
| Invention Example 8 | Si$_3$N$_4$ | Cu-7 mass % P | 40 | Hf | 0.5 |
| Invention Example 9 | Si$_3$N$_4$ | Cu-7 mass % P-15 mass % Sn-5mass % Cr | 15 | Zr | 0.3 |
| Comparative Example | Si$_3$N$_4$ | Cu-7 mass % P-15 mass % Sn-10 mass % Ni | 20 | Ti | 1.5 |

TABLE 2

| | Bonding conditions | | | | Evaluation | | |
|---|---|---|---|---|---|---|---|
| | Pressing load (MPa) | Heating temperature (° C.) | Heating rate (° C./min) | Holding time (min) | Active metal compound layer | | Ultrasonic wave bonding property |
| | | | | | Material | Crystallinity | |
| Invention Example 1 | 5 | 950 | 15 | 120 | Ti-0 | Crystalline | A |
| Invention Example 2 | 15 | 850 | 5 | 150 | Ti-0 | Crystalline | A |
| Invention Example 3 | 1 | 770 | 13 | 15 | Ti-0 | Crystalline | A |

TABLE 2-continued

| | Bonding conditions | | | | Evaluation | | |
|---|---|---|---|---|---|---|---|
| | Pressing load | Heating temperature | Heating rate | Holding time | Active metal compound layer | | Ultrasonic wave bonding property |
| | (MPa) | (° C.) | (° C./min) | (min) | Material | Crystallinity | |
| Invention Example 4 | 5 | 980 | 10 | 100 | Zr-N | Crystalline | A |
| Invention Example 5 | 35 | 850 | 5 | 100 | Zr-N | Crystalline | A |
| Invention Example 6 | 5 | 930 | 20 | 120 | Ti-N | Crystalline | A |
| Invention Example 7 | 1 | 810 | 10 | 30 | Nb-N | Crystalline | A |
| Invention Example 8 | 15 | 930 | 7 | 5 | Hf-0 | Crystalline | A |
| Invention Example 9 | 3 | 950 | 13 | 120 | Zr-0 | Crystalline | A |
| Comparative Example | 5 | 930 | 3 | 120 | Ti-0 | Amorphous | B |

In the Comparative Examples in which the active metal compound layer was amorphous, no peeling was observed at the joint interface between the copper sheet and the ceramic substrate after the joining with ultrasonic waves; however, peeling was confirmed as a result of performing an inspection with the ultrasonic flaw detector.

On the other hand, in Example 1-9 of the present invention in which the active metal compound layer was crystalline, no peeling was observed at the joint interface of the copper sheet and the ceramic substrate after ultrasonic wave joining and peeling was not confirmed as a result of inspection using an ultrasonic flaw detector.

In addition, referring to FIG. 9, in Example 1 of the present invention, it was confirmed that a crystalline active metal compound layer (rutile-type Ti—O layer) was formed at the interface portion of the ceramic substrate.

Further, referring to FIG. 10, in Example 1 of the present invention, it was confirmed that the active metal concentration (Ti concentration) at the interface portion of the ceramic substrate was higher than in Comparative Example 1.

From the above, according to the Examples of the present invention, it was confirmed that it is possible to provide a bonded body which is able to suppress peeling of a ceramic member and a copper member even when joining with ultrasonic waves is performed, and an insulating circuit substrate.

Example 2

Using the brazing material and active metal material shown in Table 3, copper sheets formed of oxygen-free copper (37 mm×37 mm×0.8 mm thickness) are sequentially laminated on both surfaces of a ceramic substrate (40 mm×40 mm×0.32 mm thickness) formed of the material shown in Table 3 to form a laminate.

Then, the laminate was put into a vacuum heating furnace in a state of being pressed with the load shown in Table 4 and heated to join the respective copper sheets to both surfaces of the ceramic substrate. The heating temperature and time were as shown in Table 4.

As described above, the joint bodies of the Examples of the present invention were obtained. For the obtained joint bodies, the "Material and Crystallinity of Active Metal Compound Layer", the "Thickness of Active Metal Compound Layer", and the "Thermal Cycle Reliability" were evaluated. The "Material and Crystallinity of Active Metal Compound Layer" was evaluated in the same manner as in Example 1.

(Thickness of Active Metal Compound Layer)

Measurement was carried out using a transmission electron microscope (Titan ChemiSTEM, manufactured by FEI, accelerating voltage: 200 kV) at a magnification of 80,000 times to acquire element mapping of the N, O, and active metal element using the energy dispersive X-ray analysis method (NSS7 manufactured by Thermo Scientific). It was determined that an active metal compound layer was present in a case where the active metal element and N or O existed in the same region.

The observation was performed in five visual fields, and the average value obtained by dividing the area of the range where the active metal element and N or O existed in the same region by the measured width was defined as the "Thickness of Active Metal Compound Layer".

(Thermal Cycle Reliability)

Using a thermal shock tester (TSA-72ES manufactured by ESPEC CORP.), a thermal cycle of −50° C.×10 min↔175° C.×10 min in the gas phase was carried out for up to 2000 cycles.

Every 200 cycles, the presence or absence of cracking in the ceramic substrate was determined by an interface inspection using an ultrasonic flaw detector (FineSAT200 manufactured by Hitachi Power Solutions Co., Ltd.).

TABLE 3

| | Ceramic substrate Material | Brazing material | | Active metal material | |
|---|---|---|---|---|---|
| | | Material | Thickness (μm) | Material | Thickness (μm) |
| Invention Example 11 | $Si_3N_4$ | Cu-6.3 mass % P-9.3 mass % Sn-7 mass % Ni | 20 | Ti | 0.3 |
| Invention Example 12 | $Si_3N_4$ | Cu-6.3 mass % P-9.3 mass % Sn-7 mass % Ni | 20 | Ti | 0.3 |
| Invention Example 13 | $Si_3N_4$ | Cu-6.3 mass % P-9.3 mass % Sn-7 mass % Ni | 20 | Ti | 0.3 |

TABLE 3-continued

| | Ceramic substrate Material | Brazing material Material | Brazing material Thickness (μm) | Active metal material Material | Active metal material Thickness (μm) |
|---|---|---|---|---|---|
| Invention Example 14 | Si₃N₄ | Cu-7 mass % P-15 mass % Zn-5 mass % Cr | 15 | Zr | 0.3 |
| Invention Example 15 | Si₃N₄ | Cu-7 mass % P-15 mass % Zn-5 mass % Cr | 15 | Zr | 0.3 |
| Invention Example 16 | Si₃N₄ | Cu-7 mass % P-15 mass % Zn-5 mass % Cr | 15 | Zr | 0.3 |
| Invention Example 17 | Si₃N₄ | Cu-7 mass % P | 40 | Hf | 0.5 |
| Invention Example 18 | Si₃N₄ | Cu-7 mass % P | 40 | Hf | 0.5 |
| Invention Example 19 | Si₃N₄ | Cu-7 mass % P | 40 | Hf | 0.5 |
| Invention Example 20 | Si₃N₄ | Cu-7 mass % P-15 mass % Sn-5 mass % Cr | 35 | Nb | 1.8 |
| Invention Example 21 | Si₃N₄ | Cu-7 mass % P-15 mass % Sn-5 mass % Cr | 35 | Nb | 1.8 |
| Invention Example 22 | Si₃N₄ | Cu-7 mass % P-15 mass % Sn-5 mass % Cr | 35 | Nb | 1.8 |

TABLE 4

| | Bonding conditions | | | | Evaluation | | | Ceramic cracking |
|---|---|---|---|---|---|---|---|---|
| | | Heating | | | Active metal compound layer | | | |
| | Pressing load (MPa) | temperature (° C.) | Heating rate (° C./min) | Holding time (min) | Material | Crystallinity | Thickness (nm) | cycle number (times) |
| Invention Example 11 | 5 | 950 | 15 | 5 | Ti-O | Crystalline | 6.3 | >2000 |
| Invention Example 12 | 5 | 950 | 15 | 20 | Ti-O | Crystalline | 14.5 | >2000 |
| Invention Example 13 | 5 | 950 | 15 | 120 | Ti-O | Crystalline | 37.2 | 2000 |
| Invention Example 14 | 3 | 950 | 13 | 30 | Zr-O | Crystalline | 18.4 | >2000 |
| Invention Example 15 | 3 | 950 | 13 | 90 | Zr-O | Crystalline | 37.3 | 1800 |
| Invention Example 16 | 3 | 950 | 13 | 120 | Zr-O | Crystalline | 45.5 | 1800 |
| Invention Example 17 | 15 | 850 | 7 | 5 | Hf-O | Crystalline | 1.5 | >2000 |
| Invention Example 18 | 15 | 890 | 7 | 5 | Hf-O | Crystalline | 3.2 | >2000 |
| Invention Example 19 | 15 | 930 | 7 | 5 | Hf-O | Crystalline | 6.8 | >2000 |
| Invention Example 20 | 1 | 810 | 10 | 30 | Nb-O | Crystalline | 58.7 | 1600 |
| Invention Example 21 | 1 | 890 | 10 | 30 | Nb-N | Crystalline | 99.5 | 1200 |
| Invention Example 22 | 1 | 970 | 10 | 30 | Nb-N | Crystalline | 147.4 | 800 |

In Examples 11 to 22 of the present invention in which the thickness of the active metal compound layer was in the range of 1.5 nm or more and 150 nm or less, it was confirmed that the number of the thermal cycle at which ceramic cracking was generated was 800 or more and that the thermal cycle reliability was excellent. In particular, in Examples 11, 12, 14, 17, 18, and 19 of the present invention in which the thickness of the active metal compound layer was in the range of 1.5 nm or more and 20 nm or less, cracking of the ceramic substrate was not confirmed even after loading of 2000 thermal cycles and it was confirmed that the thermal cycle reliability was particularly excellent.

From the above, in a case where greater thermal cycle reliability is required, the thickness of the active metal compound layer is preferably in a range of 1.5 nm or more and 150 nm or less, and more preferably in a range of 1.5 nm or more and 20 nm or less.

INDUSTRIAL APPLICABILITY

According to the present invention, it is possible to provide a bonded body which is able to suppress peeling of a ceramic member and a copper member even in a case where joining with ultrasonic waves is performed, and an insulating circuit substrate.

REFERENCE SIGNS LIST 1, 101 Power module
3 Semiconductor element (electronic component)
10, 110 Insulating circuit substrate (bonded body)
11 Ceramic substrate (ceramic member)
12, 112 Circuit layer
13, 113 Metal layer
22, 23, 122 Copper sheet (copper member)
30, 130 Joint layer

What is claimed is:

1. A bonded body formed to configure to join a ceramic member formed of a Si-based ceramic and a copper member formed of copper or a copper alloy,
    wherein, a joint layer is formed between the ceramic member and the copper member,
    the joint layer includes a crystalline active metal compound layer and an alloy layer,
    the crystalline active metal compound layer, formed of a compound including an active metal, is formed on a ceramic member side,
    the alloy layer is formed between the active metal compound layer and the copper member, and
    the alloy layer containing, an alloy or an intermetallic compound including Cu—P based brazing material, is formed on a copper member side.

2. The bonded body according to claim 1,
    wherein a thickness of the active metal compound layer is in a range of 1.5 nm or more and 150 nm or less.

3. The bonded body according to claim 2,
    wherein the active metal compound layer contains one of an active metal nitride and an active metal oxide.

4. An insulating circuit substrate comprising:
    the bonded body according to claim 3,
    a ceramic substrate formed of the ceramic member; and
    a circuit layer formed of the copper member formed on one surface of the ceramic substrate.

5. The insulating circuit substrate according to claim 4,
    wherein a metal layer is formed on a surface of the ceramic substrate on an opposite side to the circuit layer.

6. The insulating circuit substrate according to claim 5,
    wherein the metal layer is formed of copper or a copper alloy.

7. The insulating circuit substrate according to claim 5,
    wherein the metal layer is formed of aluminum or an aluminum alloy.

8. An insulating circuit substrate comprising:
    the bonded body according to claim 2,
    a ceramic substrate formed of the ceramic member; and
    a circuit layer formed of the copper member formed on one surface of the ceramic substrate.

9. The insulating circuit substrate according to claim 8,
    wherein a metal layer is formed on a surface of the ceramic substrate on an opposite side to the circuit layer.

10. The insulating circuit substrate according to claim 9,
    wherein the metal layer is formed of copper or a copper alloy.

11. The insulating circuit substrate according to claim 9,
    wherein the metal layer is formed of aluminum or an aluminum alloy.

12. The bonded body according to claim 1,
    wherein the active metal compound layer contains one of an active metal nitride and an active metal oxide.

13. An insulating circuit substrate comprising:
    the bonded body according to claim 12,
    a ceramic substrate formed of the ceramic member; and
    a circuit layer formed of the copper member formed on one surface of the ceramic substrate.

14. The insulating circuit substrate according to claim 13,
    wherein a metal layer is formed on a surface of the ceramic substrate on an opposite side to the circuit layer.

15. The insulating circuit substrate according to claim 14,
    wherein the metal layer is formed of copper or a copper alloy.

16. The insulating circuit substrate according to claim 14,
    wherein the metal layer is formed of aluminum or an aluminum alloy.

17. An insulating circuit substrate comprising:
    the bonded body according to claim 1,
    a ceramic substrate formed of the ceramic member; and
    a circuit layer formed of the copper member formed on one surface of the ceramic substrate.

18. The insulating circuit substrate according to claim 17,
    wherein a metal layer is formed on a surface of the ceramic substrate on an opposite side to the circuit layer.

19. The insulating circuit substrate according to claim 18,
    wherein the metal layer is formed of copper or a copper alloy.

20. The insulating circuit substrate according to claim 18,
    wherein the metal layer is formed of aluminum or an aluminum alloy.

* * * * *